US007993985B2

(12) United States Patent
Shih et al.

(10) Patent No.: US 7,993,985 B2
(45) Date of Patent: Aug. 9, 2011

(54) METHOD FOR FORMING A SEMICONDUCTOR DEVICE WITH A SINGLE-SIDED BURIED STRAP

(75) Inventors: Neng-Tai Shih, Taipei (TW); Ming-Cheng Chang, Taipei (TW)

(73) Assignee: Nanya Technology Corp., Taiwan (CN)

( * ) Notice: Subject to any disclaimer, the term of this patent is extended or adjusted under 35 U.S.C. 154(b) by 88 days.

(21) Appl. No.: 12/035,542

(22) Filed: Feb. 22, 2008

(65) Prior Publication Data

US 2008/0268590 A1    Oct. 30, 2008

(30) Foreign Application Priority Data

Apr. 27, 2007    (TW) .............................. 96114933 A

(51) Int. Cl.
*H01L 21/335* (2006.01)
(52) U.S. Cl. .. 438/142; 438/243; 438/245; 257/E21.646
(58) Field of Classification Search .................. 438/142, 438/243–245; 257/301–315, E21.646
See application file for complete search history.

(56) References Cited

U.S. PATENT DOCUMENTS

| 7,078,756 B2 * | 7/2006 | Otani et al. ................. 257/296 |
| 2001/0044190 A1 | 11/2001 | Heo et al. |
| 2005/0001256 A1 * | 1/2005 | Chen et al. ................. 257/301 |
| 2005/0045949 A1 | 3/2005 | Lin et al. |
| 2005/0139889 A1 * | 6/2005 | Wang ........................... 257/296 |
| 2005/0167719 A1 * | 8/2005 | Chen et al. ................. 257/301 |
| 2005/0199878 A1 * | 9/2005 | Arao et al. ..................... 257/66 |
| 2006/0263970 A1 * | 11/2006 | Jang ............................. 438/238 |
| 2007/0117239 A1 * | 5/2007 | Ishi ............................... 438/30 |
| 2008/0009112 A1 * | 1/2008 | Lee et al. ..................... 438/245 |

FOREIGN PATENT DOCUMENTS

| TW | 457643 B | 10/2001 |
| TW | 231993 B | 5/2005 |

OTHER PUBLICATIONS

Office Action dated Aug. 14, 2010, issued in Taiwan Patent Application No. 096114933.

* cited by examiner

*Primary Examiner* — Charles D Garber
*Assistant Examiner* — Abdulfattah Mustapha
(74) *Attorney, Agent, or Firm* — Ingrassia Fisher & Lorenz, P.C.

(57) ABSTRACT

A method for forming a semiconductor device with a single-sided buried strap is provided. The method includes the steps of providing a substrate with a trench, forming a semiconductor component in a lower portion of the trench to expose a higher portion of the trench, forming a first dielectric layer on a sidewall of the higher portion of the trench, forming a first conductive layer in the trench and adjacent to the first dielectric layer, forming a second dielectric layer on the first dielectric layer and the first conductive layer, forming a plurality of gate structures on the substrate, wherein one of the gate structures on the second dielectric layer is offset for a distance from the second dielectric layer, removing a portion of the second dielectric layer and a portion of the first dielectric layer to form an opening by using the gate structure as a mask, and forming a second conductive layer in the opening to electrically couple to the first conductive layer, whereby the semiconductor device with the single sided buried strap is formed.

6 Claims, 4 Drawing Sheets

METHOD FOR FORMING A SEMICONDUCTOR DEVICE WITH A SINGLE-SIDED BURIED STRAP

CROSS REFERENCE TO RELATED APPLICATIONS

This application claims the right of priority based on Taiwan Patent Application No. 096114933 entitled "Method For Forming Semiconductor Device With Single Sided Buried Strap", filed on Apr. 27, 2007, which is incorporated herein by reference and assigned to the assignee herein.

FIELD OF THE INVENTION

The present invention relates to a method for forming a single-sided buried strap, and more particularly, to a method of forming a semiconductor device with a single-sided buried strap to reduce the dopant out-diffusion and the resistance of conduction path.

BACKGROUND OF THE INVENTION

The Dynamic Random Access Memory (DRAM) cells are typically composed of two main components, a storage capacitor for storing charges and an access transistor for transferring charge to and from the storage charge. The storage capacitor can be either a planar capacitor on the surface of a semiconductor substrate or a trench capacitor etched into the semiconductor substrate. As the technologies advance, the size of the semiconductor device is continuously scaled down. Because the layout of the trench capacitor results in a dramatic reduction in the space without sacrificing capacitance, the trench capacitors are predominantly used in the semiconductor device.

For DRAM cells, the electrical connection between the storage capacitor and the access transistor is critical for maintaining their functionality. The electrical connection between the trench capacitor and the transistor is generally a buried strap structure, which is formed between a source/drain junction of the access transistor and the electrode of storage capacitor. However, the traditional buried strap is often subjected to several subsequent thermal processes that cause lots of dopant to out-diffuse from the buried strap resulting in serious sub-threshold leakage. Additionally, the traditional buried strap also bears relative high connection resistance, and the process steps are very complicated. Moreover, for an array type configuration, the buried strap generally only locates in a single side and has the disadvantages, such as complicated manufacturing processes and a high defect density caused by the etching/refilling processes etc.

Therefore, there is a need to provide a method for forming a single-sided buried strap to effectively inhibit the dopant out-diffusion and reduce the defects resulted from the etching/refilling steps.

SUMMARY OF THE INVENTION

The present invention describes a method for forming a single-sided buried strap, which effectively decreases the dopant out-diffusion and the resistance of conduction path.

The invention provides a method for forming a single-sided buried strap, which effectively simplifies the manufacturing steps by using self-aligned process.

In one embodiment, the invention provides a method for forming a semiconductor device with a single-sided buried strap, which includes providing a substrate with a trench; forming a semiconductor component in a lower portion of the trench to expose a higher portion of the trench; forming a first dielectric layer on a sidewall of the higher portion of the trench; forming a first conductive layer in the trench and adjacent to the first dielectric layer; forming a second dielectric layer on the first dielectric layer and the first conductive layer; forming a plurality of gate structures on the substrate, wherein a gate structure on the second dielectric layer is offset for a distance from the second dielectric layer; removing a portion of the second dielectric layer and a portion of the first dielectric layer to form an opening by using the gate structure as a mask; and forming a second conductive layer in the opening to electrically couple with the first conductive layer.

Moreover, in an exemplary embodiment, the step of forming the semiconductor component includes forming a trench capacitor, and the step of forming a first conductive layer includes forming a polysilicon layer. The step of forming a first conductive layer includes depositing a polysilicon layer in the trench and etching back the polysilicon layer so that the polysilicon layer is coplanar with the first dielectric layer. The step of forming a plurality of gate structures includes: shifting the gate structure the distance from the second dielectric layer, so that a portion of the first conductive layer is exposed after the step of removing a portion of the second dielectric layer and a portion of the first dielectric layer. The method further includes a step of forming a source/drain region adjacent to the gate structure before the step of forming the opening. Alternatively, the step of forming a source/drain region adjacent to the gate structure is performed after the step of forming the opening.

DETAILED DESCRIPTION OF THE INVENTION

Figure 1A:
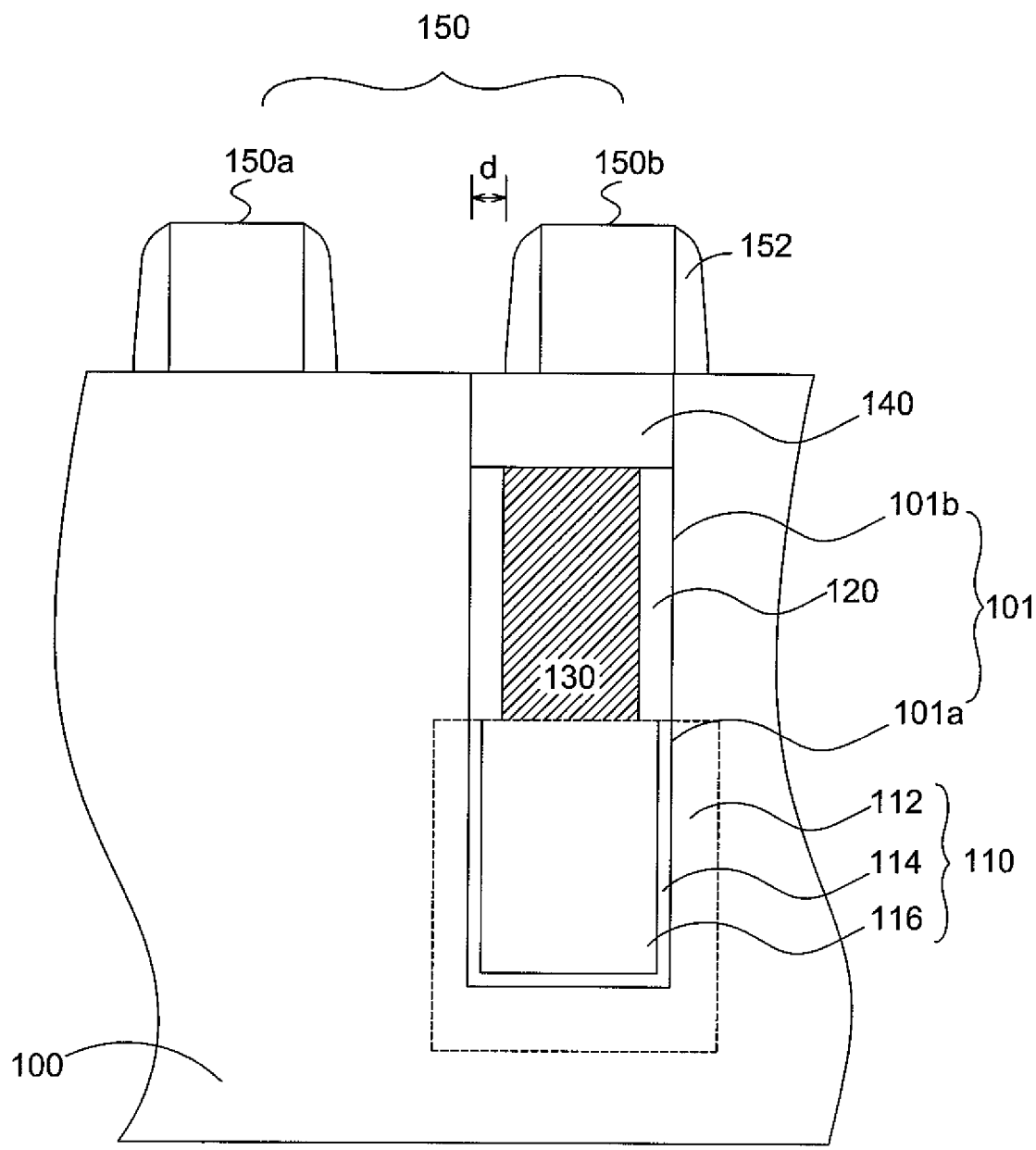
FIG. 1A to FIG. 1D illustrates a method for forming a single-sided buried strap in accordance with one embodiment of the present invention.

The present invention discloses a method for forming a semiconductor device with a single-sided buried strap. The present invention can be further understood by referring to the following description accompanied with the drawing in FIG. 1A to FIG. 1D.

Referring to FIG. 1A, in one embodiment, the present invention provides a substrate 100 with a trench 101, which may be formed by forming a pad layer on the substrate 100 and then patterning the substrate 100 by photolithography and etching processes to form the trench 101 in the substrate 100. For example, the pad layer can be an oxide layer, a nitride layer or the combination thereof. As shown in FIG. 1A, the trench 101 has a lower portion 101a and a higher portion 101b. According to different design need, different semiconductor component may be formed in the trench 101, and in the instant embodiment, a semiconductor component, such as a capacitor, is formed. In this embodiment, a capacitor 110 is formed in the lower portion 101a of the trench 101. For example, the capacitor 110 can be a conventional vertical capacitor, which sequentially includes a lower electrode 112, a capacitor dielectric layer 114, and an upper electrode 116, from the bottom to the top of the trench 101. The lower electrode 112 can be, for example, a diffusion area in the substrate 100, and the capacitor dielectric 114 can be an oxide layer, a nitride layer, a dielectric layer having appropriate dielectric character, and the combination thereof. The upper electrode 116 is formed on the capacitor dielectric layer 114 and etched back to a depth to expose the higher portion 101b of the trench 101 over the capacitor 110. The capacitor 110 may be formed by conventional processes, such as doping, diffusion, deposition, and etching, to form the structure shown in FIG. 1A.

Next, a dielectric spacer 120 is formed in trench 101 over the capacitor 110. For example, a dielectric layer, such as an oxide layer, is conformally deposited on the capacitor 110 in the trench 101. A portion of dielectric layer is removed by a dry etching process to remain a portion of dielectric layer on the sidewall of the trench 101 so as to form the dielectric spacer 120. That is, the dielectric spacer 120 is formed on the sidewall of the higher portion 101b of the trench 101. A conductive layer 130 is then formed on the higher portion 101b of the trench 101, i.e. in the trench 101 over the capacitor 110, by chemical vapor deposition, and the conductive layer 130 is etched back. For example, a polysilicon layer is filled into the trench 101 above the capacitor 110 by chemical vapor deposition and then recessed by etching, so that the conductive layer (polysilicon layer) 130 in the higher portion 101b of the trench 101 is adjacent and coplanar with the dielectric spacer 120. Then, a dielectric layer is formed on the dielectric spacer 120 and the conductive layer 130 to form a top dielectric layer 140 on the top portion of the trench 101. For example, an oxide layer may be formed on the higher portion 101b of the trench 101 by chemical vapor deposition and then planarized by chemical mechanical planarization (CMP), so that the top dielectric layer (oxide layer) 140 is formed over the dielectric spacer 120 and the conductive layer 130. Please note that the application of the pad layer may be modified based on different process and is not elaborated hereinafter. For example, after the top dielectric layer 140 is formed, the pad layer can be removed, so that the top dielectric layer 140 is coplanar with the top surface of the substrate 100.

Referring again to FIG. 1A, a plurality of gate structures 150, such as an active gate 150a and a passive gate 150b which is above the trench 101, is formed on the substrate 100. For example, the plurality of gate structures 150 is formed on the substrate by conventional steps, such as deposition, photolithography, and etching. Because each gate structure is substantially the same as the others, the following description will be only focused on one gate structure.

Each gate structure 150 may include, for example, a gate dielectric layer, a gate conductive layer, and a cap layer. Additionally, the gate structure 150 of this instant embodiment may also include a gate spacer 152. The gate spacer 152 is formed by forming a conformal layer, such as a nitride layer, on the gate structure 150, and a portion of the conformal layer is removed by dry etching to form the gate spacer 152 on the sidewall of the gate structure 150. In the embodiment, the arrangement of the gate structure 150 is offset for a distance "d" from the top dielectric layer 140. For example, the gate structure (the passive gate) 150b above the top dielectric layer 140 is arranged to expose at least a portion of the top dielectric layer 104 corresponding to its underlying dielectric spacer 120.

Figure 1B:
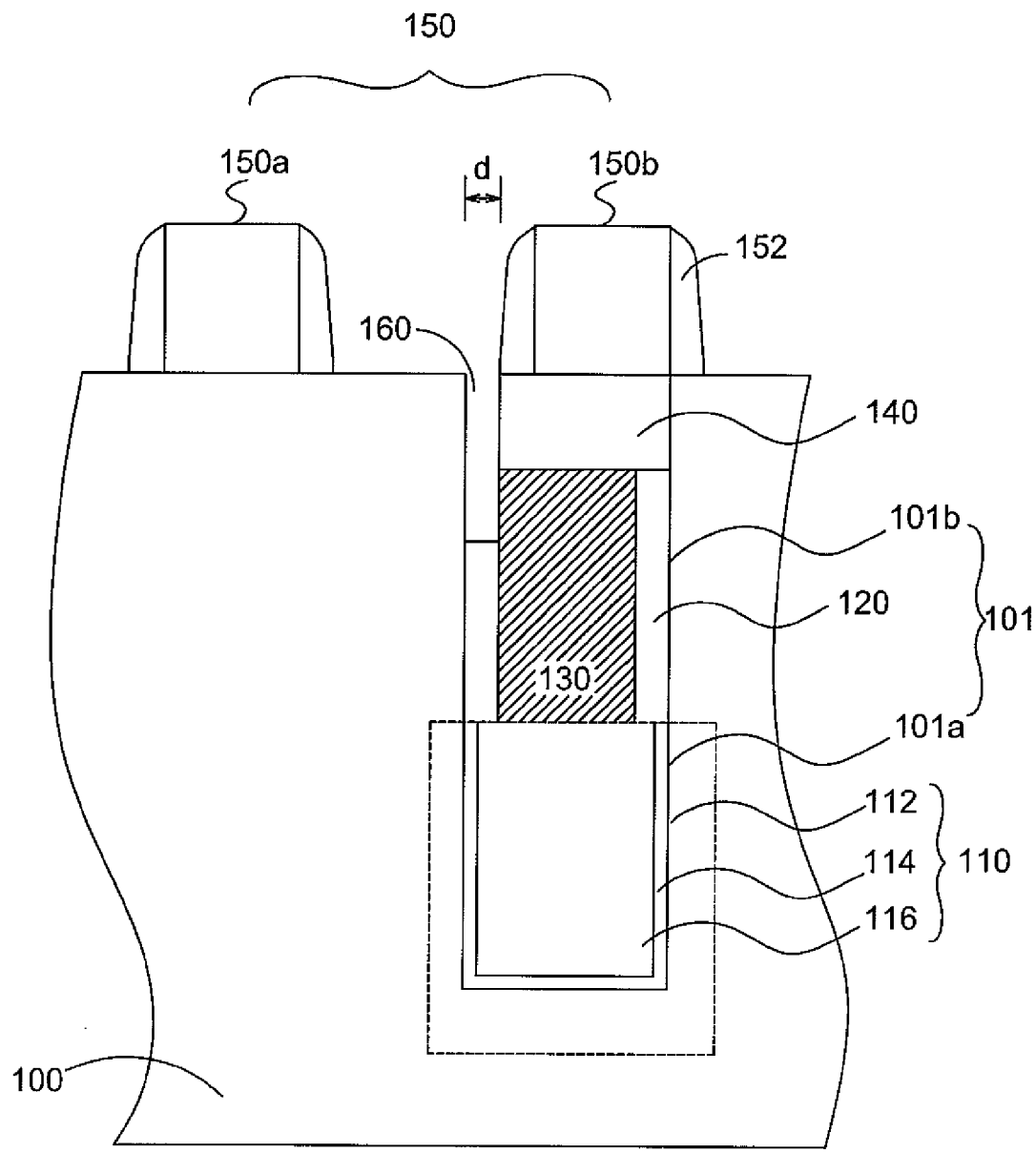

Referring to FIG. 1B, the top dielectric layer 140 and the dielectric spacer 120 not protected by the gate structure 150 are selectively removed by using dry etching. For example, portions of the top dielectric layer 140 and of the dielectric spacer 120 within the distance "d" are removed so as to expose a portion of the conductive layer 130. In other words, by using the passive gate structure 150b shifted from the dielectric layer 140 as a mask and the application of the etching selectivity among the gate structures 150, the substrate 100, the top dielectric layer 140, and the dielectric spacer 120, a portion of the top dielectric layer 140 and a portion of the dielectric spacer 120 can be removed by self-aligned process without additional photomasking process, and accordingly, an opening 160 is formed to expose a portion of the conductive layer 130.

Figure 1C:
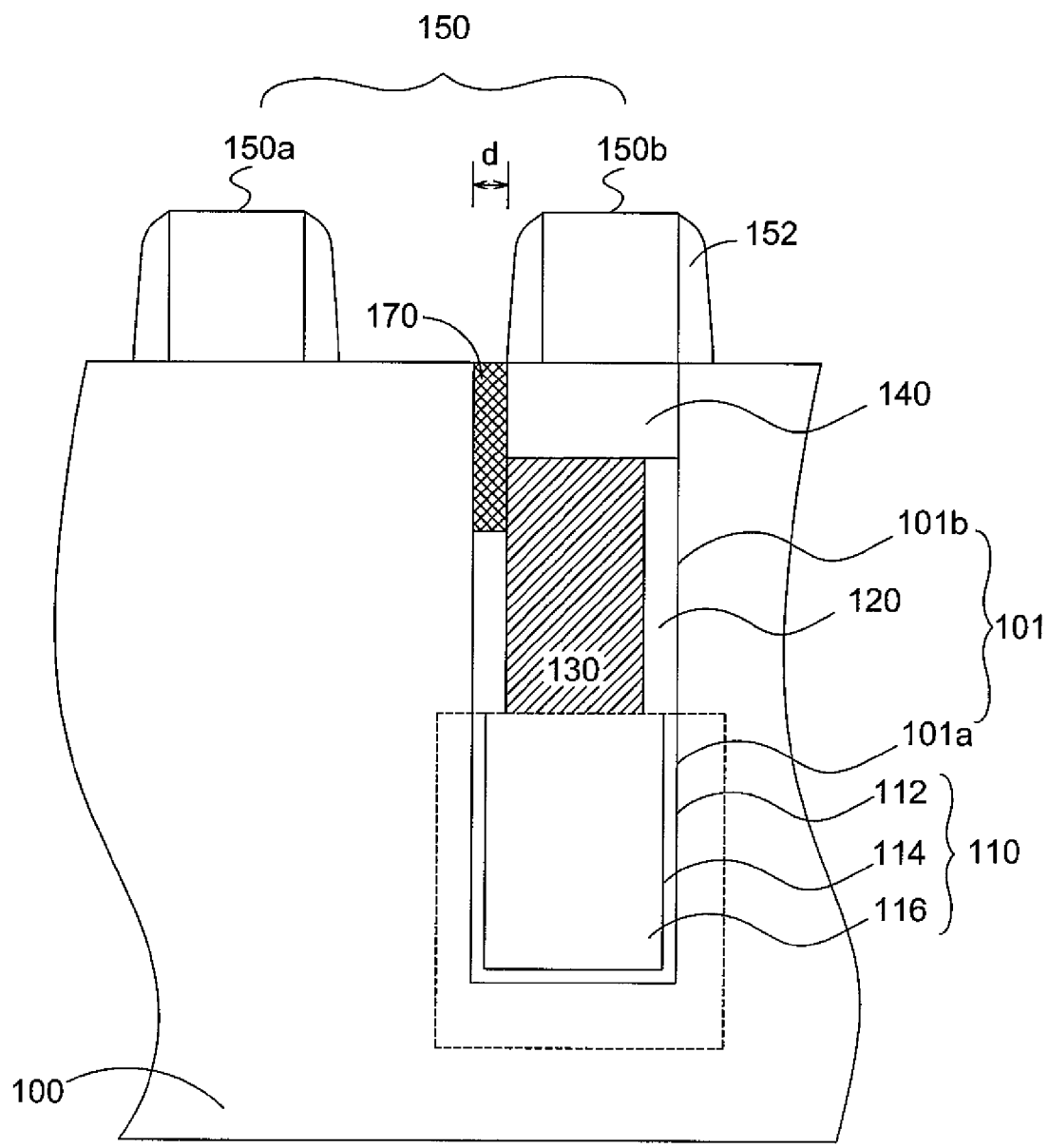
Figure 1D:
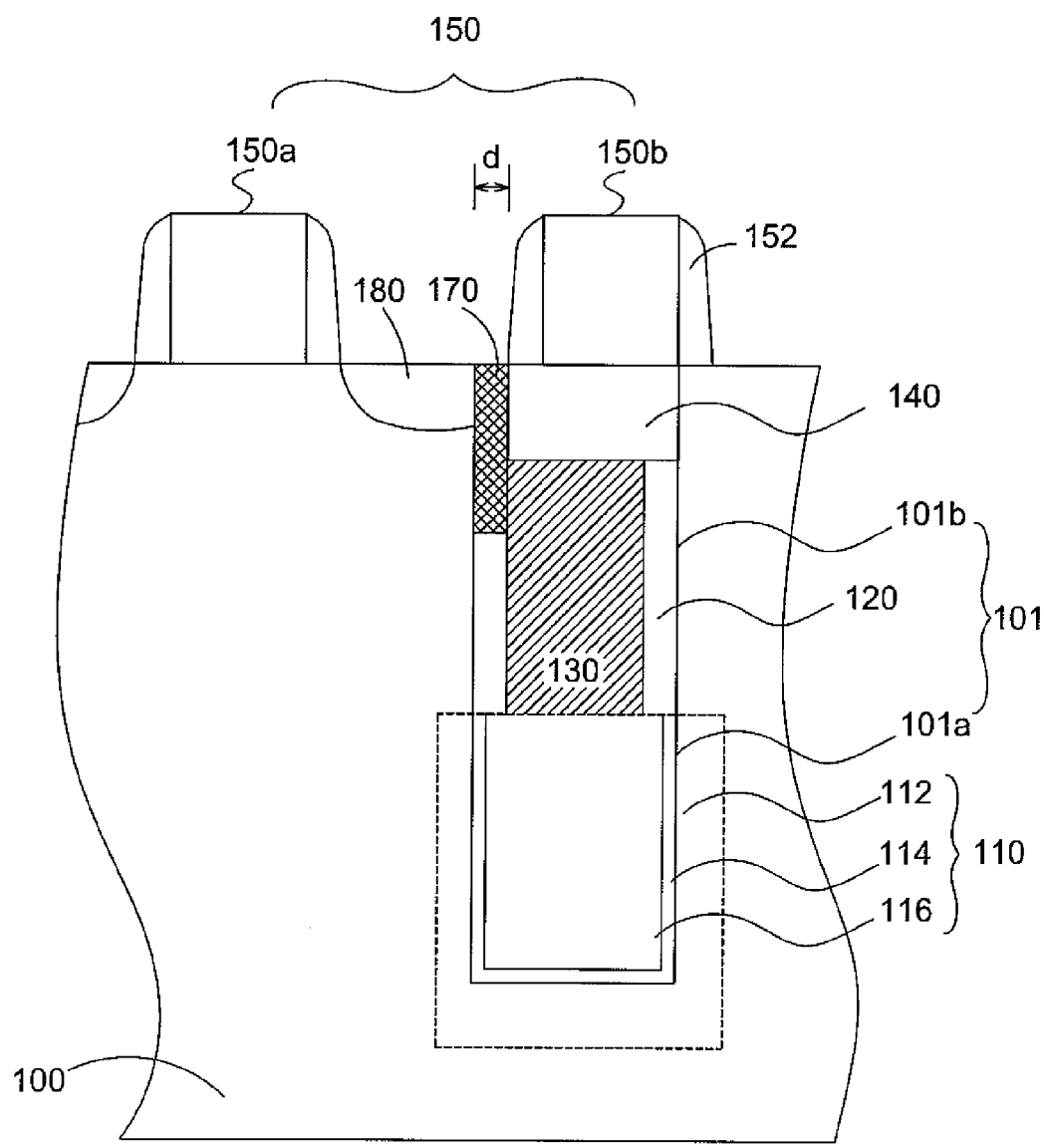

Referring to FIG. 1C and still taking FIG. 1B for reference, another conductive layer is formed in the opening 160 to electrically couple to the conductive layer 130 so as to form a single-sided buried strap 170. For example, an epitaxial silicon (epi-Si) layer can be formed in the opening 160 by Selective Epi-silicon Growth (SEG) to electrically couple to the conductive layer 130, and accordingly, the single sided buried strap 170 is formed. Then, conventional semiconductor processes can be performed to complete the formation of a memory cell. For example, a source/drain region 180 can be formed adjacent to the gate structure (active gate) 150a and the single-sided buried strap 170 to form a memory device having a capacitor and a transistor, as shown in FIG. 1D. Additionally, in another embodiment of the present invention, the method further includes the processes of forming various contacts, metalization etc. to complete the formation of a semiconductor device having a single-sided buried strap 170. Alternatively, the steps of forming the opening 160 or the single-sided buried strap 170 can be performed after forming the source/drain region 180.

The single-sided buried strap 170 of the present invention is formed after the gate structure 150 so that the impact of thermal processes, such as the gate dielectric layer thermal growth, annealing, or ion implantation, on the single-sided buried strap can be minimized, and the dopant out-diffusion and the resistance of the conduction path can be reduced. Moreover, the present invention utilizes the formed gate structure 150 and the application of the etching selectivity among different materials, so as to self-align the location of the single-sided buried strap 170, and eliminates the need of the conventional photolithography process. Accordingly, the present invention has the advantage of simplifying the manufacturing process. Please note that although only two gate structures are illustrated in the embodiment, those skilled in the art may easily recognize that the number of the gate structures can be modified in accordance with different design need. Moreover, the trench semiconductor component is not limited to the vertical capacitor illustrated in the embodiment, and the present invention can be applied to any suitable semiconductor device required of a single sided buried strap.

Although specific embodiments have been illustrated and described, it will be obvious to those skilled in the art that various modifications may be made without departing from what is intended to be limited solely by the appended claims.

What is claimed is:

1. A method for forming a semiconductor device with a single-sided buried strap, comprising:
   providing a substrate with a trench;
   forming a first dielectric layer on a sidewall of a higher portion of the trench;
   filling a first conductive layer into the trench to be adjacent to the first dielectric layer;
   forming a second dielectric layer on the first dielectric layer and the first conductive layer;
   forming a plurality of gate structures on the substrate, wherein one of the gate structures on the second dielectric layer is offset for a distance from the second dielectric layer;
   removing a portion of the second dielectric layer and a portion of the first dielectric layer to form an opening by using the gate structure as a mask;

forming a second conductive layer in the opening to electrically couple to the first conductive layer, wherein the second conductive layer is the single sided buried strap; and forming a source/drain region adjacent to the gate structure and the single sided buried strap.

2. The method for forming a semiconductor device with a single-sided buried strap of claim 1, wherein said substrate, said gate structures and said first dielectric layer have a first etch selectively.

3. The method for forming a semiconductor device with a single-sided buried strap of claim 1, wherein said substrate, said gate structures and said second dielectric layer have a second etch selectively.

4. The method for forming a semiconductor device with a single-sided buried strap of claim 1 further comprising forming said source/drain region adjacent to said gate structures before said step of forming said opening.

5. The method for forming a semiconductor device with a single-sided buried strap of claim 1 further comprising forming said source/drain region adjacent to said gate structures after said step of forming said opening.

6. The method for forming a semiconductor device with a single-sided buried strap of claim 1, wherein said step of forming a second conductive layer comprises a process of selective epitaxial silicon growth.

* * * * *